(12) United States Patent
Ibok

(10) Patent No.: US 6,329,256 B1
(45) Date of Patent: Dec. 11, 2001

(54) SELF-ALIGNED DAMASCENE GATE FORMATION WITH LOW GATE RESISTANCE

(75) Inventor: Effiong Ibok, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/666,088

(22) Filed: Sep. 21, 2000

Related U.S. Application Data

(60) Provisional application No. 60/155,597, filed on Sep. 24, 1999.

(51) Int. Cl.$^7$ ................................................. H01L 21/3205
(52) U.S. Cl. ........................ 438/299; 438/301; 438/584; 438/585; 438/586; 438/652; 438/655; 438/657
(58) Field of Search ..................................... 438/586, 585, 438/649, 672, 648, 647, 637, 597, 592, 584, 301, 299, 652, 655, 657

(56) References Cited

U.S. PATENT DOCUMENTS

| | | | |
|---|---|---|---|
| 6,090,676 | * | 7/2000 | Gardner et al. ....................... 438/303 |
| 6,093,628 | * | 7/2000 | Lim et al. ............................. 438/592 |
| 6,100,142 | * | 8/2000 | Liao ..................................... 438/291 |
| 6,222,240 | * | 4/2001 | Gardner et al. ....................... 257/410 |
| 6,225,170 | * | 5/2001 | Ibok et al. ............................ 438/291 |

* cited by examiner

Primary Examiner—Richard Elms
Assistant Examiner—Beth E. Owens

(57) ABSTRACT

In order to form a self-aligned damascene gate which enables the resistance of the gate to be reduced, a thick layer of dielectric material is formed over a semiconductor substrate in which drain and source regions have previously been implanted and annealed. The dielectric layer is polished for planarity using a chemical-mechanical-polishing (CMP) technique or the like. A gate mask is then used to pattern the dielectric, the interlayer dielectric (ILD) is etched, and the resist is stripped. A gate dielectric is deposited in the form of a CVD nitride, oxynitride, or stacked nitride oxide ONO, or the like. Polysilicon is then deposited over the dielectric, doped by implantation, and annealed. A silicon rich silicide layer is then deposited after which CMP or the like is used to remove the superfluous portions of the silicide, doped polysilicon and gate oxide layers down to the dielectric level. The surface is then cleaned and annealed to induce the excess silicon to migrate to the surface of the remaining plug-like portion of silicon rich suicide material and form a thin silicon layer thereon. A contact mask is then formed and contact areas etched. The polysilicon layer at the gate site and the silicon exposed at the contact site are then reacted to form salicides.

5 Claims, 5 Drawing Sheets

SELF-ALIGNED DAMASCENE GATE FORMATION WITH LOW GATE RESISTANCE

RELATED APPLICATIONS

This application claims priority from Provisional Application Serial No. 60/155,597, filed on Sep. 24, 1999 entitled: "SELF-ALIGNED DAMASCENE GATE FORMATION WITH LOW GATE RESISTANCE", the entire disclosure of which is hereby incorporated by reference therein.

BACKGROUND OF THE INVENTION

1. Field of the Invention

The present invention relates generally to gate formation and more specifically to a method of forming a self-aligned damascene gate which enables the resistance of the gate to be reduced.

2. Description of the Related Art

Fabrication of an integrated circuit involves numerous processing steps. After impurity regions have been deposited within a semiconductor substrate and gate areas defined upon the substrate, interconnect routing is formed on the semiconductor topography and connected to contact areas to form an integrated circuit. The entire process of making an ohmic contact to the contact areas and routing interconnect material between ohmic contacts is described generically as "metallization". This process, as is well known can involve electrically conductive materials other than metals per se. Nevertheless, as the complexity of integrated circuits has increased, the complexity of the metallization composition has also increased.

The impurity regions deposited within a semiconductor substrate are often referred to as junctions. A junction is generally configured near a gate conductor within a substrate. Earlier contact structures involved depositing an interlevel dielectric over the junctions and gate conductors, and then etching an opening or window through the interlevel dielectric directly above the junctions to which contact is to be made. This etching, however, involved numerous problems. For example, the contact window opening required an additional masking step. Unfortunately, the mask is often times misaligned with the junction, resulting in an increase in junction capacitance. Additionally, opening a window of minimum size through a relatively thick interlevel dielectric is, by its nature, problematic, in order to achieve a relatively anisotropic etch, a plasma etch is required, leaving deleterious amounts of etch byproducts (e.g., polymers) at the base of the opening. Still further, difficulties arise whenever the interconnect material must extend over the interlevel dielectric and into the relatively small opening through the interlevel dielectric. Most conventional interconnect materials, such as aluminum, were unable to fill the openings without "cusping", or without encountering step coverage at the juncture between the window and the interlevel dielectric surface.

More modern contact structures make use of contacts which are self-aligned with the junctions. More specifically, those contacts are referred to as self-aligned suicides, or so called "salicides". A salicide process involves depositing a metal across the semiconductor topography, and then reacting the metal only in regions where silicon molecules are present. As a result of this reaction step, silicides form only at the upper surfaces of the junctions and the upper surfaces of the polysilicon gate conductors. A region between the junctions and the gate conductor upper surfaces is often provided with a sidewall spacer generally formed from silicon dioxide (oxide).

An interlevel dielectric is formed after the suicides are self-aligned to the silicon-bearing underlayers. This interlevel dielectric undergoes a patterned etch over the regions to which contact must be made. However, the pattern etch placement is not deemed as crucial as the etch needed to form a contact window in pre-salicide processes.

More specifically, the etch to the underlying salicide need only contact a portion of the salicide and need not be carefully bounded to the entire perimeter of the salicide. Another advantage to using a salicide, beyond its self-aligned properties, is the retained purity of the silicon-based material prior to silicide growth. Silicide is grown upon and into the junctions without necessarily having to pre-clean those surfaces of interlevel dielectric etch byproducts commonly encountered in pre-salicide techniques.

Furthermore, the techniques which are currently employed in prevailing art gate dielectric formations, gate deposition and patterning and contact formation are carried out sequentially. Accordingly, at high densities gate profile, contact misalignment and salicide bridging are all causes of performance and yield degradation.

SUMMARY OF THE INVENTION

The present invention is based on a technique of forming a self-aligned damascene gate with an attendant contact or contacts which attenuates the above-mentioned problems through the use of a uniquely different fabrication process.

One embodiment of the present invention is such as to cover doped source and drain regions with a thick layer of a dielectric material, pattern and use a first etching technique to form an opening in the thick dielectric layer at locations which all but penetrates to the surface of the underlying semiconductor substrate. Following this a second WET etching technique is used to expose the surface of the substrate.

Following this, a layer of oxide is formed which covers the upper surface of the dielectric layer along with the side walls and the exposed substrate exposed at the bottom of the opening. Next, a layer of poly amorphous silicon is formed over the oxide layer. This layer however, is deposited only to the degree that a thickness which at most about ½ of the normal target thickness, is formed. This layer accordingly, is such that opening remains only partly filled and defines a void therein. This layer is then doped so as to act as a dopant reservoir.

Next, a layer of silicon rich tungsten silicide is deposited over the poly amorphous silicon layer. This layer fills the void left the polysilicon deposition. This is followed by polishing (e.g. chemical-mechanical-polishing (CMP)) to remove the superficial portions of the tungsten silicide layer, along with the portions of the dopedpolyamorphous silicon and oxide layers, down to the level of the dielectric layer.

At this stage, the plug-like remnants of the tungsten silicide layer which fills the void is cleaned and subsequently annealed. This heat treatment drives the excess silicon contained in the silicon rich tungsten silicide material, to the surface of the plug and to form a thin film having a thickness of about 500 Å. At the same time amorphous polysilicon is induced to undergo a change in crystal structure.

A contact mask is then formed. This covers the gate site and permits the dielectric thick layer to be etched out until the semiconductive silicon substrate is reached. The mask is then stripped and the exposed silicon at the bottom of the contact hole or holes and the silicon layer atop the salicide plug are then reacted for produce silicide layers and hence for a salicide.

The gate structure which is formed in this manner exhibits a significantly reduced resistance in the bulk of the gate material, excluding the salicide, is tungsten silicide which has a given suitable resistivity thus causing the gate resistance to be significantly reduced.

BRIEF DESCRIPTION OF THE DRAWINGS

The various features and advantages of the present invention will become more clearly appreciated as a detailed description of the preferred embodiments of the invention is given with reference to the appended drawings in which.

DETAILED DESCRIPTION OF THE PREFERRED EMBODIMENTS

FIGS. 1–14 depict the stages of the fabrication of a self-aligned damascene gate which enables the resistance of the gate to be reduced. In this embodiment, source and drain regions 101, 102 are formed in a silicon substrate 104. The structure which is depicted in the figures can be either a P-doped substrate or a N-doped well or the reverse, and for simplicity the illustration is limited to a pair of source and drain regions.

Figure 1:
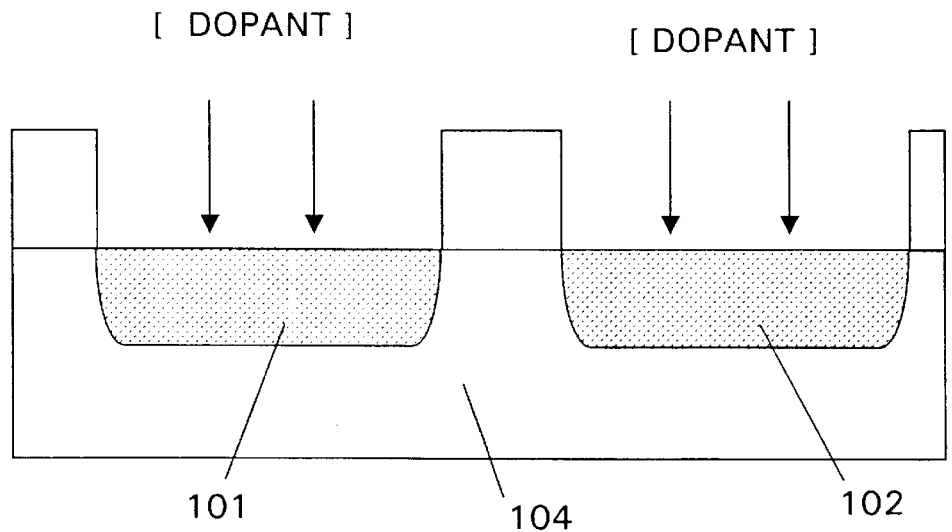
FIG. 1 shows a substrate being doped using a conventional implantation technique in preparation for the formation of source and drain regions.
Figure 2:
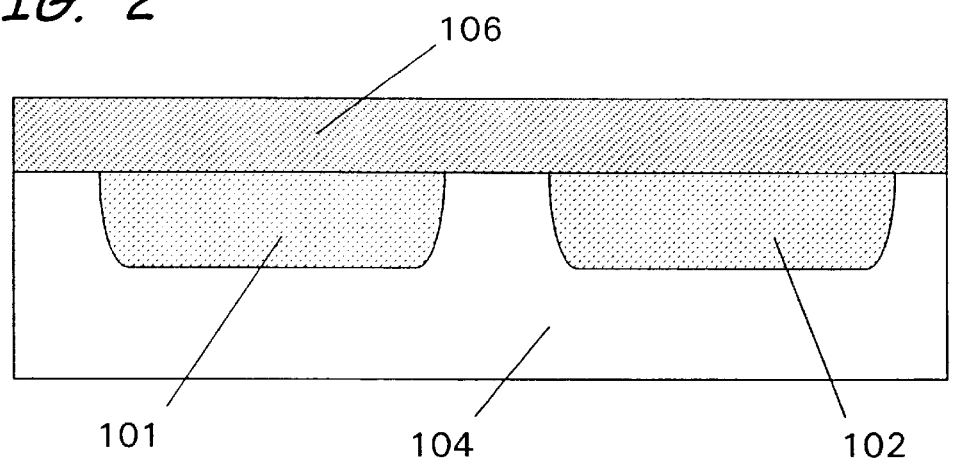
FIG. 2 shows the substrate shown in FIG. 1, covered with a thick dielectric layer formed by using either PECVD, thermal oxidation, or nitridation.

As shown, in FIG. 2, the source and drain regions 101, 102 are covered with a thick layer of a dielectric material 106. The layer 106 can be formed using any suitable technique such as PECVD, thermal oxidation, or nitridation. As will be appreciated as the disclosure proceeds, the thickness of this layer, this embodiment, generally controls the height of the gate.

Figure 3:
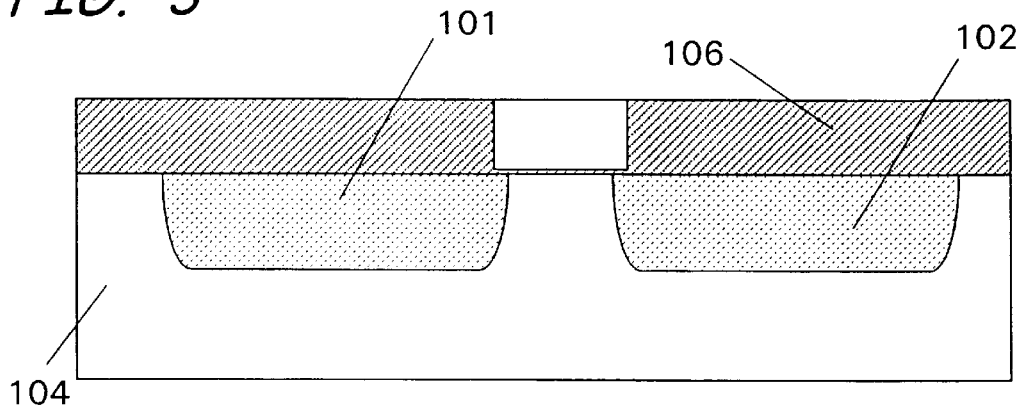
FIG. 3 shows the first stage of a the formation of an opening in the thick dielectric layer wherein the depth of the opening almost reaches the underlying silicon semiconductor substrate.
Figure 4:
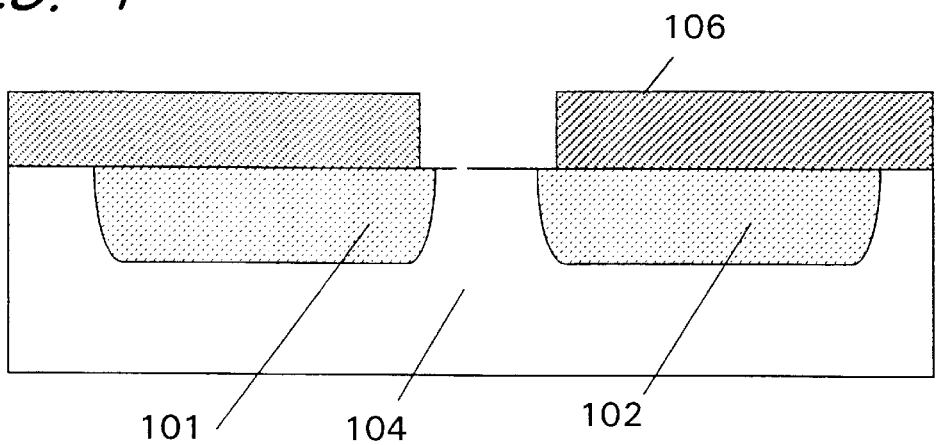
FIG. 4 shows a opening being completed and the surface of the substrate exposed.

Next, a gate mask is formed and etching is used to remove the dielectric material down to just before the substrate 104 in the manner depicted in FIG. 3. This is then followed by a WET etch which removes the final portion of the dielectric material and exposes the surface of the semiconductive substrate 104 in the manner shown in FIG. 4.

Figure 5:
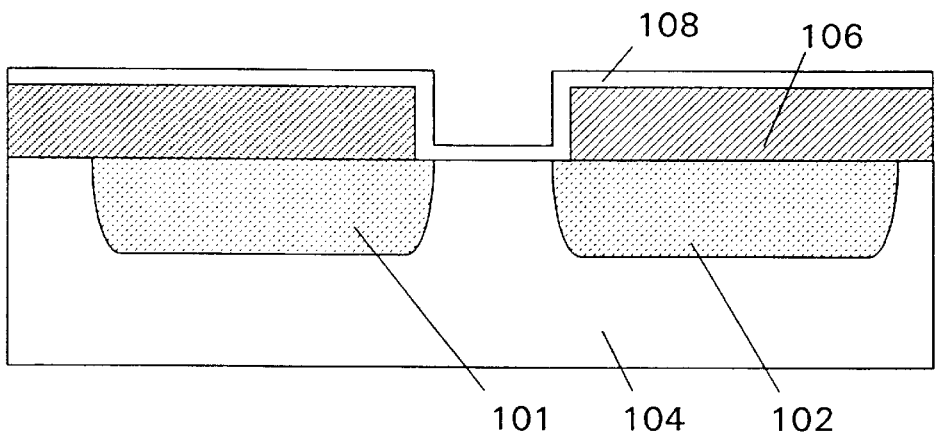
FIG. 5 shows the formation of an oxide, nitride or ONO layer over the surface of the dielectric layer and surfaces of the opening.
Figure 6:
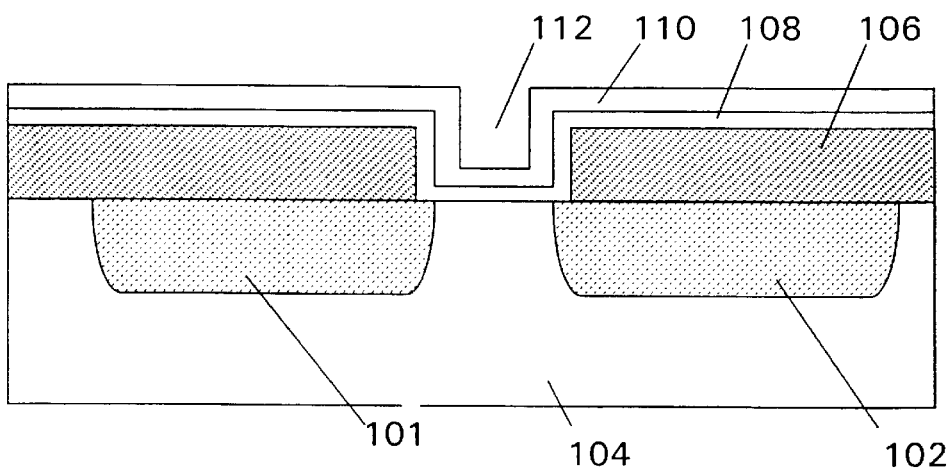
FIG. 6 shows a relatively thin layer of poly amorphous silicon formed over the oxide layer to as to leave the opening only partially filled and form a void.
Figure 7:
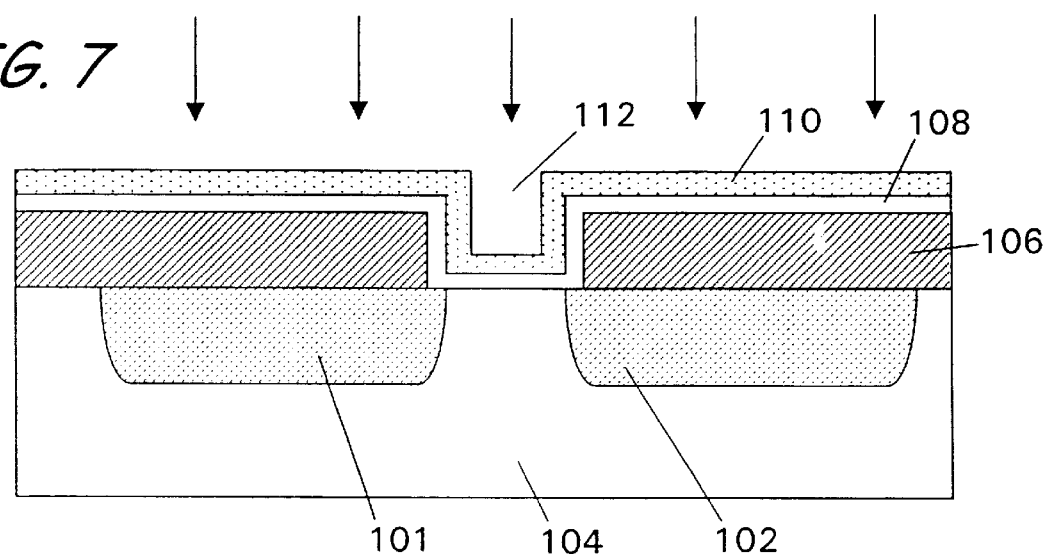
FIG. 7 shows doping which is used to impregnate the poly amorphous silicon.

Following this, as shown in FIG. 5, a layer of oxide 108 is formed which covers the upper surface of the dielectric layer along with the side walls and the exposed substrate exposed at the bottom of the opening. Next, a layer of poly amorphous silicon 110 is formed over the oxide layer 108. This polysilicon layer 110 is however, deposited in an amount which is less than in the case of conventional processes and only to the degree that a thickness which at most about ½ of the normal target thickness, is laid down.

This layer is such that gate opening remains only partly filled and defines a void 112 therein. This layer 110 is then doped (see FIG. 7) so as to act as a dopant reservoir. In this case the doping is carried out using ion implantation. The doping of this layer can be carried out using suitable dopants which are implanted at a known dosage and energy level.

Figure 8:
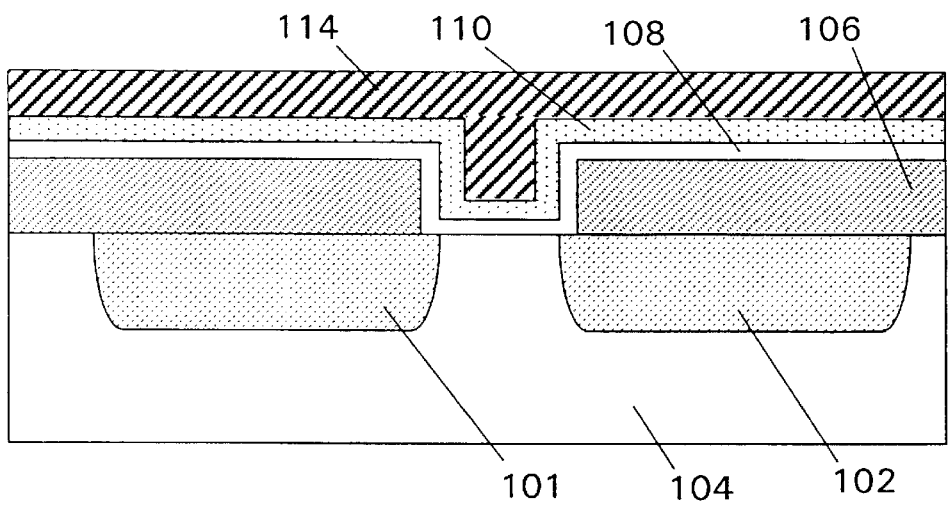
FIG. 8 depicts the formation of a silicon rich metal silicide layer over the doped polysilicon layer and which fills the void.
Figure 9:
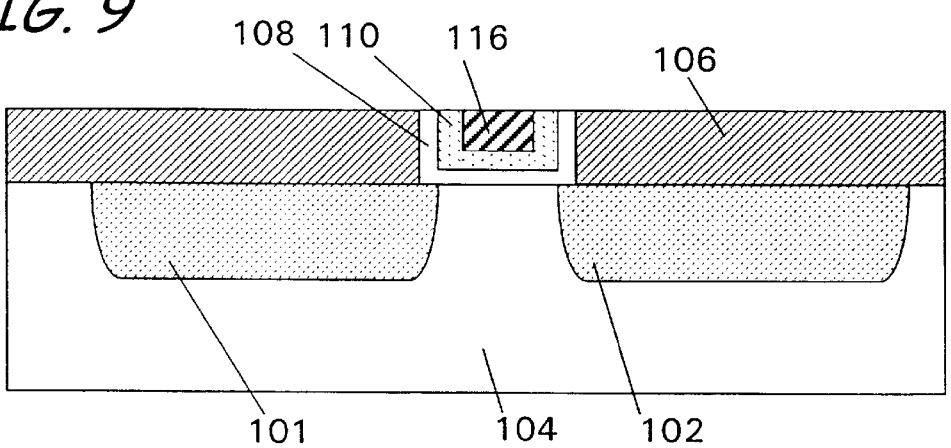
FIG. 9 depicts the results of a polishing operation which removes the superfluous portions of the metal silicide, doped poly amorphous silicon and oxide layers down to the level of the dielectric layer.
Figure 10:
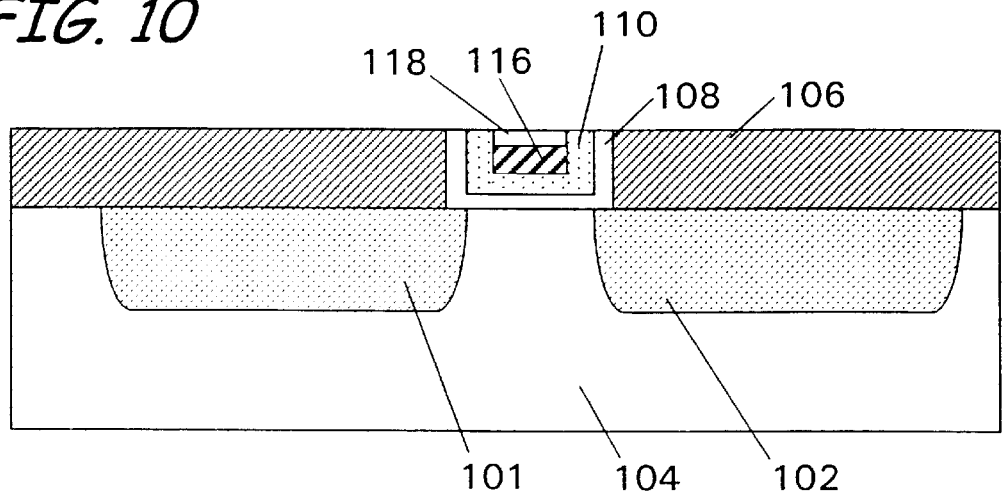
FIG. 10 shows the results of an annealing process which drives excess silicon contained in the plug of metal silicide material which remains seated in the void, to the surface of plug and forms a thin film of silicon thereon suitable for reaction and the formation of a layer of silicide.

Next, as depicted in FIG. 8, a layer of silicon rich tungsten silicide 114 is deposited over the poly amorphous silicon layer 110. This layer fills the void 112 left by the limited polysilicon deposition. This tungsten silicide layer is deposited to a predetermined depth. This is followed by polishing (e.g. chemical-mechanical-polishing (CMP)) to remove the superficial portions of the tungsten silicide layer 110, along with the portion of the doped poly amorphous silicon and silicide layers 110 and 106, down to the level of the dielectric layer 106, and so as to assume the configuration shown in FIG. 9.

At this stage, the plug-like remnant 116 of the tungsten silicide layer 114 which fills the void 112, is cleaned and subsequently annealed. This heat treatment drives the excess silicon contained in the silicon rich tungsten silicide material, to the surface of the plug 116 and to form a thin film 118 having a thickness of about 500 Å in the manner depicted in FIG. 10. At the same time the poly amorphous silicon is induced to undergo a change in crystal structure.

Figure 11:
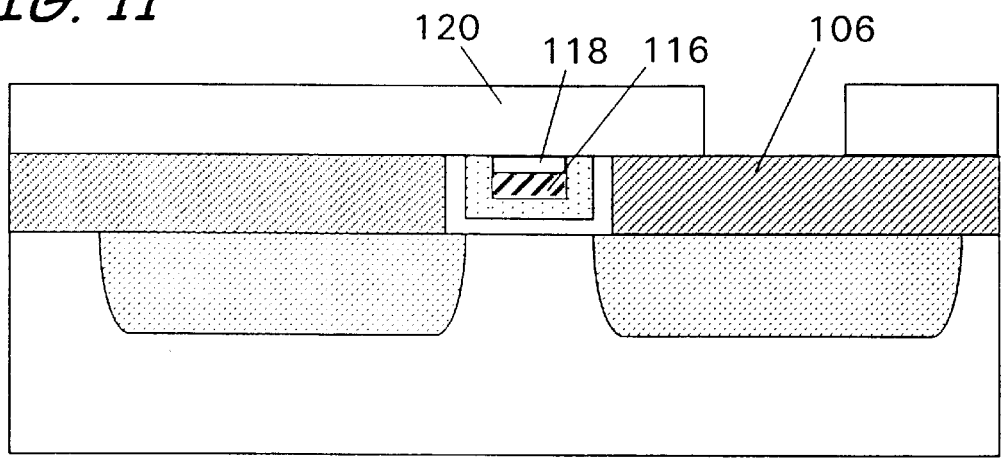
FIG. 11 depicts a mask formation which is used to form an opening in the dielectric layer.
Figure 12:
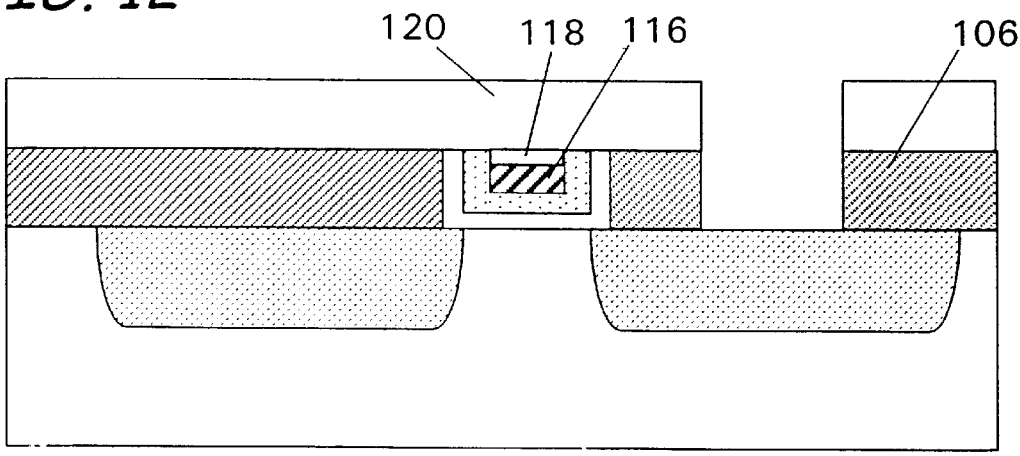
FIG. 12 shows a formation of a hole which extends through to one of the source and drain regions.

A contact mask 120 is then formed in the manner illustrated in FIG. 11. This covers the gate site and permits the dielectric thick layer 106 to be etched until the semiconductive silicon substrate 104 is reached (FIG. 12).

Figure 13:
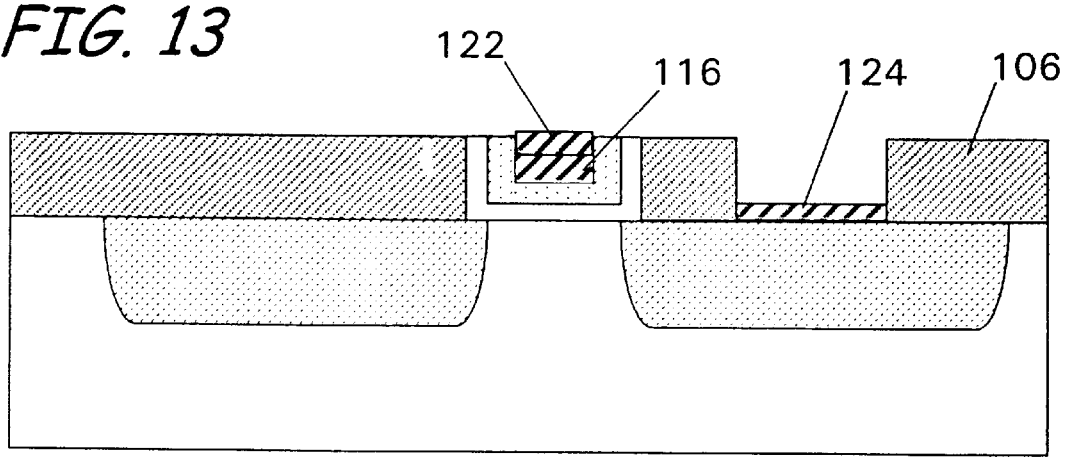
FIG. 13 depicts the formation silicide layers on the thin silicon film formed on the upper surface of the metal silicide plug, and the exposed surface of the substrate at the bottom of the second opening

The mask 120 is then stripped and the exposed silicon at the bottom of the contact hole or holes and the silicon layer 118 atop the salicide plug 116 are reacted with a metal film to produce silicide layers 122, 124 and hence form a salicide in the manner depicted in FIG. 13. The gate structure which is formed in this manner exhibits a significantly reduced resistance in the bulk of the gate material, excluding the salicide, which is tungsten silicide which has a given resistivity, thus causing the gate resistance to be significantly reduced.

Figure 14:
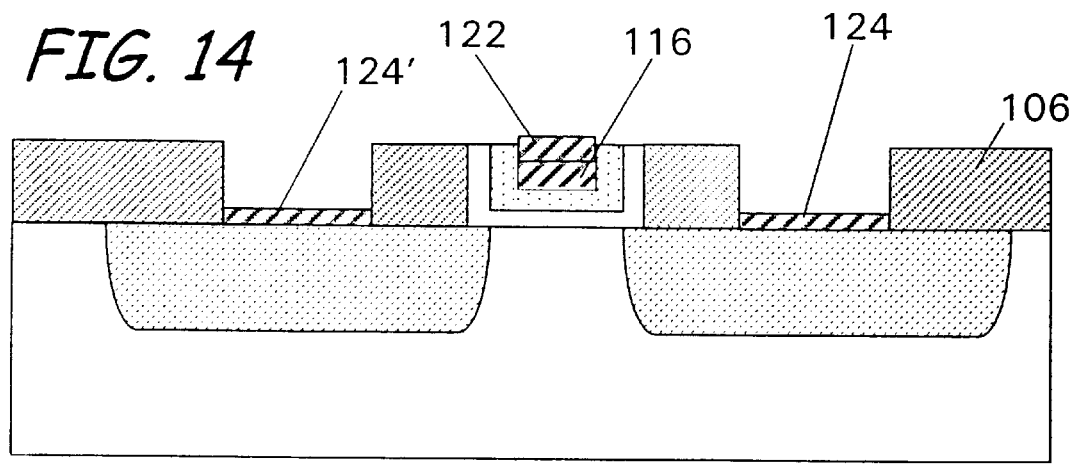
FIG. 14 is a figure similar to FIG. 13 which shows the manner in which a second opening and silicide layer can be formed over the other of the source and drain region, simply by adjusting the mask shown in FIG. 12.

FIG. 14 depicts an arrangement which can be very easily formed if the contact mask which is formed in FIG. 11, has two contact openings formed therein instead of the single one shown in FIGS. 1–13, to permit the second opening to be formed through the dielectric layer and thus enable the formation of the second contact. The contact openings are respectively covered by silicide layers 124 and 124'.

While the present invention has been disclosed with reference to only a limited number of embodiments and examples, the versatility of the invention and the various other combinations and environments in which the invention is capable of use, will be self-evident to the person skilled in the art of semiconductor fabrication.

What is claimed is:

1. A method of forming a semiconductor device having a gate and at least one contact, the method comprising the steps of:

forming a thick dielectric layer having a predetermined suitable thickness, over a semiconductor substrate in which a source region and a drain region are formed in a semiconductive silicon substrate;

forming, using a first etching process, a first opening in the dielectric layer at a site selected to be suitable for formation of the gate;

controlling the first etching process so that a depth of the first opening is controlled in a manner wherein a thin layer of dielectric remains on a bottom of the first opening over a surface of the underlying semiconductor substrate;

removing, using a second etching process, the remaining thin layer of dielectric material at the bottom of the first opening in a manner to expose the underlying semiconductor substrate;

forming an oxide layer over the dielectric layer and over a side wall surface and the bottom of the first opening;

forming a poly amorphous silicon layer over the oxide layer in an amount which is about up to half of a target thickness and such that a void still remains within the first opening;

doping the poly amorphous silicon layer with a dopant;

depositing a silicon rich silicide film over the poly amorphous silicon layer in an amount sufficient to fill the void with silicide material;

removing, using a third etching process, portions of the silicide film, the poly amorphous silicon layer and the oxide layer down to the level of the dielectric layer;

annealing the material in the first opening to drive excess silicon contained in the silicon rich silicide to a surface of the silicide material which fills the void and to form a localized layer of silicon thereover;

forming a second opening in the dielectric layer to expose a portion of one of the source and drain regions; and reacting the localized layer of silicon and the silicon of the substrate which is exposed at a bottom of the second opening with a metal layer to form a salicide structure.

2. A method of forming a semiconductor device as set forth in claim 1, wherein the step of depositing the poly amorphous silicon layer comprises depositing the layer to a predetermined depth.

3. A method of forming a semiconductor device as set forth in claim 1, wherein the step of doping the poly amorphous silicon layer with a first dopant is carried out using ion implantation.

4. A method of forming a semiconductor device as set forth in claim 1, wherein the step of annealing comprises the steps of heating the silicon rich silicide material which fills the void at a temperature subjected to induce silicon to migrate to an upper surface.

5. A semiconductor device bricated using the method of claim 1.

\* \* \* \* \*